(12) United States Patent
West

(10) Patent No.: US 6,501,706 B1
(45) Date of Patent: Dec. 31, 2002

(54) TIME-TO-DIGITAL CONVERTER

(76) Inventor: Burnell G. West, 46750 Sentinel Dr., Fremont, CA (US) 94539

( * ) Notice: Subject to any disclaimer, the term of this patent is extended or adjusted under 35 U.S.C. 154(b) by 143 days.

(21) Appl. No.: 09/643,576

(22) Filed: Aug. 22, 2000

(51) Int. Cl.$^7$ .............................................. G04F 8/00
(52) U.S. Cl. ..................................... 368/118; 368/120
(58) Field of Search ................................. 368/113, 118, 368/120; 377/20, 43

(56) References Cited

U.S. PATENT DOCUMENTS

| | | | | |
|---|---|---|---|---|
| 4,097,801 A | * | 6/1978 | Freeman et al. | 324/188 |
| 5,199,008 A | * | 3/1993 | Lockhart et al. | 368/117 |
| 5,204,678 A | * | 4/1993 | Foley | 341/152 |
| 5,684,760 A | * | 11/1997 | Hunter | 368/120 |
| 5,818,797 A | * | 10/1998 | Watanabe et al. | 368/113 |
| 6,081,484 A | * | 6/2000 | West | 368/120 |

* cited by examiner

Primary Examiner—Vit Miska

(57) ABSTRACT

A time-to-digital converter records the arrival times of successive signals—which are separated from one another by more than one period of a reference clock signal—by recording the number of nodes disposed within a plurality of fine delay paths—each coupled to a different one of a plurality of coarse delay stages in a first coarse delay path—through which the signals propagate. The delay across each fine delay path is substantially the same as the delay across a coarse delay stage in the coarse delay path. A phase detector maintains the clock signal and its delayed replica in phase by adjusting the delay through each of the coarse delay stages in a second coarse delay path. The time delay between the clock signal and its delayed replica is equal to one period of the clock signal. A plurality of registers store the voltages of the nodes within each of the fine delay paths and supply the stored results to a plurality of priority encoders for encoding the time priority with which the signals arrive at the nodes. A delay encoder determines the extent of the propagation of the successive signals through the nodes to thereby generate time-stamps representative of the arrival times of the signals.

52 Claims, 8 Drawing Sheets

TIME-TO-DIGITAL CONVERTER

FIELD OF INVENTION

The present disclosure relates to measuring time in electronic circuitry, and, in particular, to measuring the arrival time of a signal with respect to a reference clock signal.

BACKGROUND OF THE INVENTION

Time-to-Digital Converters (TDC) are used in many electronic circuits to measure the time at which a specific event occurs (e.g., the time at which a specific signal arrives). One known type of TDC measures signal arrival time by charging and discharging a capacitor at two different rates. When the signal—whose arrival time is to be measured—arrives, a control switch closes thus coupling a current source to the capacitor which is thereby charged. After a predefined number of clock signal ("clock") cycles, the control switch opens, forcing a second current source to discharge the charged capacitor. The arrival time of the signal is proportional to the ratio of the currents generated by the two current sources as well as by the frequency and the number of clock cycles between the closing and opening of the control switch. The higher the ratio of the two current sources, the greater is the accuracy with which the arrival time is measured.

Although known TDCs can accurately measure the arrival time of a signal, they are slow. Assume, for instance, that the first and second current sources (discussed above) respectively generate 10 ma and 1.6 µa of current, yielding a current ratio of 6000. Assume further that the frequency of the reference clock is 400 MHz (i.e., the period of the clock is 50 nsec) and that the control switch opens one full clock cycle after it closes. Using the above numbers, it takes 300 µsec (6,000×50 nsec) for such a TDC to measure the arrival time of a signal. The e.g. 300 µsec time interval required for such time measurements is prohibitively long thus making it impossible to measure the arrival time of two signals which are e.g. less than 300 µsec apart.

Accordingly, it would be advantageous to have a system and a method which can measure arrival times of successive signals—separated from one another by more than one period of a reference clock—with a resolution finer than the period of the reference clock.

SUMMARY

In accordance with this disclosure, a time-to-digital converter records the arrival times of successive signals which are separated from one another by more than one period of a reference clock signal. The time-to-digital converter includes among other components, a first coarse delay path which further includes N coarse delay circuits (alternatively referred to hereinbelow as coarse delay stages) connected in series; and N fine delay paths, each including (M-1) fine delay circuits (alternatively referred to as fine delay stages) connected in series to thereby provide M nodes.

The output signal of each of the N coarse delay stages in the first coarse delay path is applied to an input terminal of a different one of the fine delay paths.

The time-to-digital converter records the arrival times of successive signals with respect to a reference clock by counting the number of fine delay paths as well as the number of fine delay stages within each of the fine delay paths through which the signals propagate. The time delay across each of the N fine delay paths is equal to that across each of the coarse delay stages.

A different one of N M-bit registers is coupled to each of the M nodes of each of the fine delay paths. Each register bit stores either a 1 or a 0 depending on whether the signal to be measured propagates through the node to which the register bit is coupled.

The time-to-digital converter also includes N registered priority encoders, each coupled to a different one of the M-bit registers. Each registered priority encoder receives and performs a priority function on the M bits of the register to which it is coupled.

The time-to-digital converter also includes a coarse delay encoder coupled to each of the N registered priority encoders for determining the extent of the propagation of the signals in the coarse delay and the fine delay paths to thereby generate time stamps corresponding to the arrival times of the signals.

The arrival of the signals—independent of their times of arrival—are also recorded and transferred to a flag signal.

A second coarse delay path including N coarse delay stages—which are also connected in series—receives the reference clock signal and generates a delayed replica of the clock signal. A phase detector maintains the clock signal and its delayed replica in phase by controlling the delay across each of the N coarse delay stages in the second coarse delay path. The clock signal leads its delayed replica by one full cycle of the clock signal.

The phase detector also maintains the delay across each of the coarse delay stages in the first and second coarse delay paths the same to thereby equalize the delay of a signal across the second coarse delay path to the period of the clock signal.

A different one of N fine delay buffers disposed between each of the N coarse delay stages in the first coarse delay path and the coarse delay stage's associated fine delay path ensures that the delay of a signal across similarly positioned nodes of different fine delay paths is substantially the same. The delay across each fine delay path is substantially similar to the delay across a coarse delay stage.

The time-to-digital converter optionally includes 2N slave bias circuits, each receiving and supplying a signal to a different one of the coarse delay stages in each of the first and second coarse delay paths and to each of the N fine delay buffers.

In some embodiments, the time-to-digital converter operates differentially using differentially high and low signals in each of the first and second coarse delay paths, fine delay paths, the M-bit registers and the registered priority encoders.

In some embodiments of the time-to-digital converter, N is equal to 32, M is equal to 8, and signal arrival times are recorded with resolution of 5 psec using an 800 MHz clock.

DETAILED DESCRIPTION

Figures 1, 1A:
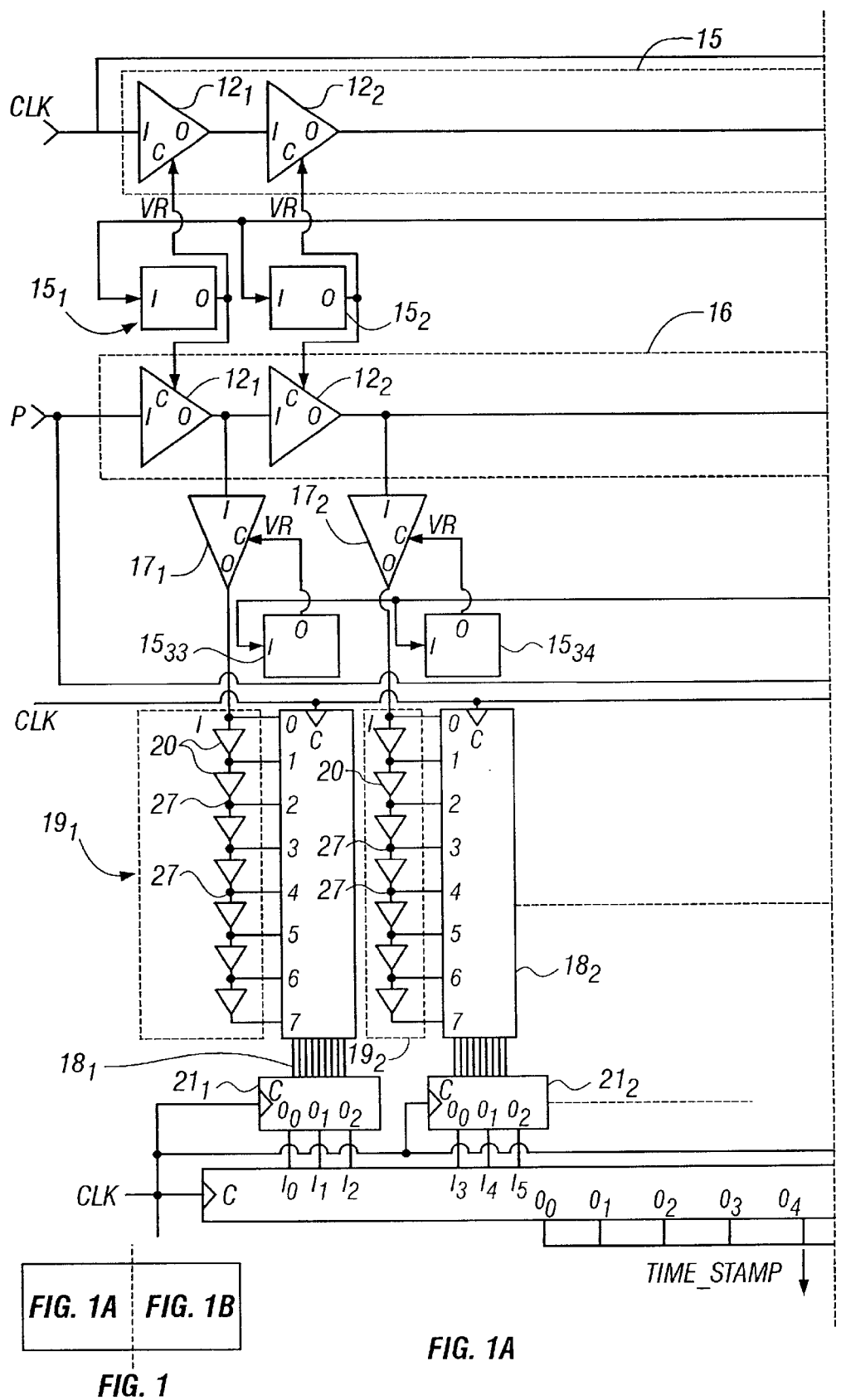
FIG. 1 is a block diagram of a time-to-digital converter, in accordance with one embodiment.
Figure 1B:
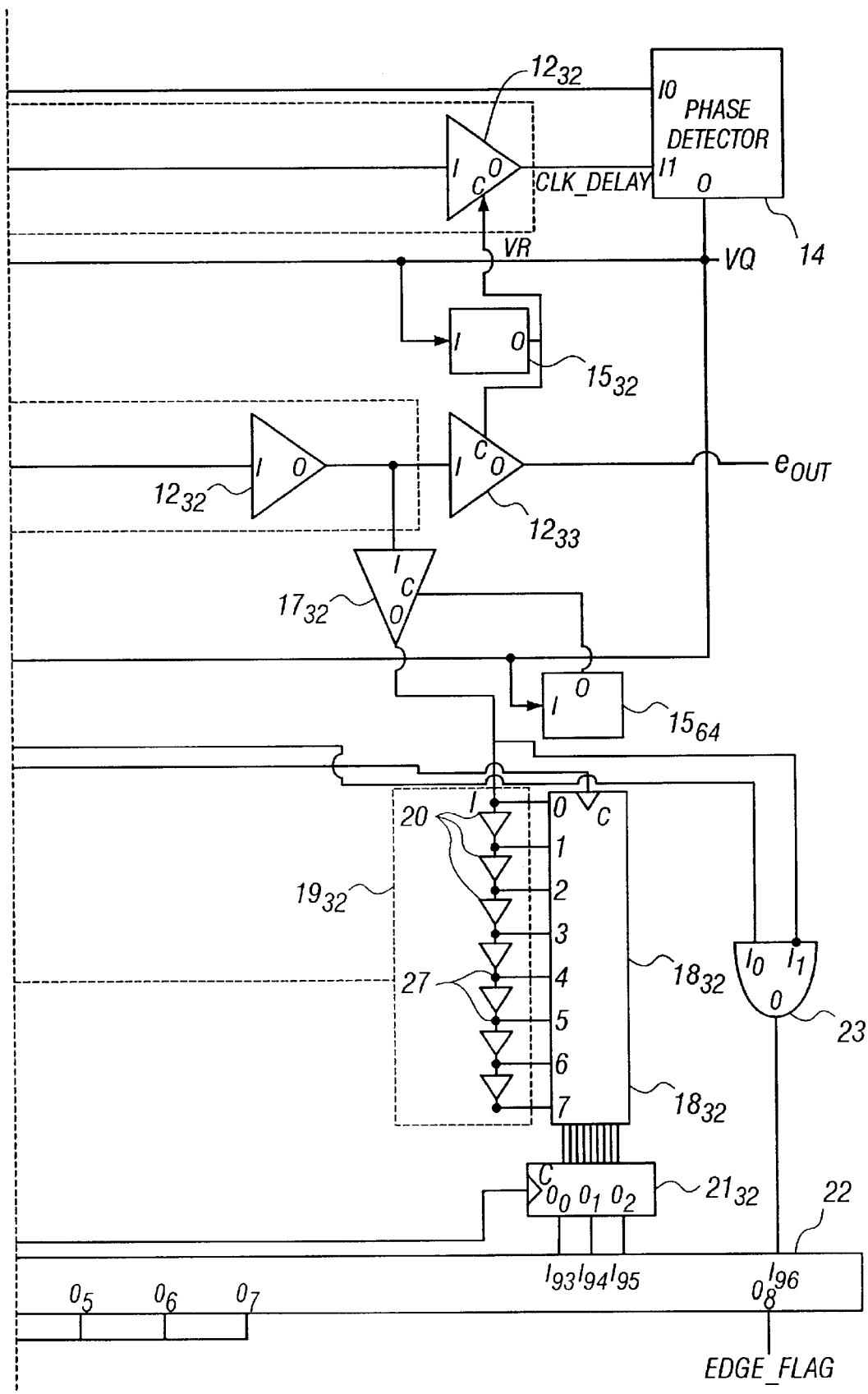

FIG. 1 shows a block diagram of time-to-digital converter (TDC) 10, in accordance with one embodiment. TDC 10 determines the arrival time of a transition on signal P within one cycle of clock signal CLK.

In the description below the subscript associated with each reference numeral designates the index number of the component identified by that reference numeral. For example, reference numeral $12_2$ identifies component 12 having index number 2.

TDC 10 includes 2 coarse delay paths each including 32 coarse delay circuits (also referred to as coarse delay stages), 32 fine delay paths each including 7 fine delay stages, 64 slave bias circuits, 32 fine delay buffers, 32 8-bit registers, an AND gate, 32 priority encoders and a delay encoder, as described in more detail below.

Referring to FIG. 1, 32 identical coarse delay stages 12—designated $12_1, 12_2, \ldots 12_{32}$—are connected in series to form coarse delay path 13 (path 13) in TDC 10. FIG. 1 only shows 3 such coarse delay stages $12_1$, $12_2$ and $12_{32}$ in delay path 13. Each coarse delay stage 12 includes input terminals I, C and output terminal O.

Clock signal CLK is applied to input terminal I of coarse delay stage $12_1$, in delay path 13. Except for coarse delay stage $12_{32}$ which generates signal CLK_delay at its output terminal O—which is coupled to input terminal $I_1$, of known phase detector 14—output terminal O of each coarse delay stage $12_i$ in path 13 drives (i.e., is coupled to) input terminal I of coarse delay stage $12_{i+1}$. For example, output terminal O of coarse delay stage $12_2$, drives input terminal I of coarse delay stage $12_2$; output terminal O of coarse delay stage $12_2$ drives input terminal I of coarse delay stage $12_3$ (not shown), etc.

Referring to FIG. 1, each of the 32 identical slave bias circuits 15—designated $15_1, 15_2, \ldots 15_{32}$—receive signal $V_R$ generated at output terminal 0 of phase detector 14. Each slave bias circuit $15_i$—where i is an integer between 1 and 32—supplies its output signal to the coarse delay stages $12_i$ in delay path 13; three such slave bias circuits, $15_1, 15_2$ and $15_{32}$, are shown in FIG. 1. For example, the signal at output terminal O of slave bias circuit $15_1$ is applied to input terminal C of coarse delay stage $12_1$; the signal at output terminal O of slave bias circuit $15_2$ is applied to input terminal C of coarse delay stage $12_2$, etc.

Signal CLK is also applied to input terminal $I_0$ of phase detector 14.

Signal VQ generated at output terminal O of phase detector 14 is applied to input terminal I of each of the 32 slave bias circuits 15.

The 32 identical coarse delay stages 12—designated $12_1, \ldots, 12_{32}$—are connected in series to form coarse delay path 16 (path 16). FIG. 1 shows 3 such coarse delay stages, $12_1$, $12_2$ and $12_{32}$ in delay path 16. Note that coarse delay stage $12_{33}$ is not part of the delay path 16 and is only provided so that the load seen by output terminal O of coarse delay stage $12_{32}$ in delay path 16 matches that seen by coarse delay stage $12_{32}$ in delay path 13. The load matching ensures that the delays across both coarse delay stages $12_{32}$ in paths 13 and 16 are substantially the same.

Signal P—whose arrival time with respect to signal CLK is recorded by TDC 10—is applied to input terminal I of coarse delay stage $12_1$, in delay path 16. Output terminal O of each coarse delay stage $12_i$ in delay path 16 drives input terminal I of coarse delay stage $12_{i+1}$ in delay path 16. For example, output terminal O of coarse delay stage $12_1$, drives input terminal I of coarse delay stage $12_2$; output terminal O of coarse delay stage $12_{31}$ drives input terminal I of coarse delay stage $12_{32}$ (not shown in FIG. 1).

Referring to FIG. 1, input terminal C of each coarse delay stage $12_i$ in delay path 16 is driven by output terminal O of the slave bias circuit $15_i$ (i varies from 1 to 32). For example, input terminal C of coarse delay stage $12_1$, in delay path 16 is driven by output terminal O of slave bias circuit $15_1$, and input terminal C of coarse delay stage $12_{32}$ in delay path 16 is driven by output terminal O of slave bias circuit $15_{32}$.

TDC 10 further includes 32 fine delay buffers 17—designated $17_1, 17_2, \ldots, 17_{32}$ of which, namely delay buffers $17_1, 17_2$ and $17_{32}$ are shown in FIG. 1. Each of the 32 fine delay buffers 17 has two input terminals I, C and one output terminal O.

Input terminal I of each fine delay buffer $17_i$ is driven by output terminal O of coarse delay stages $12_i$ in delay path 16 (i varies from 1 to 32). For example, input terminal I of fine delay buffer $17_1$, is driven by output terminal O of coarse delay stage $12_1$, in delay path 16, and input terminal I of fine delay buffer $17_2$ is driven by output terminal O of coarse delay stage $12_2$ in delay path 16

Further included in TDC 10 are 32 identical slave bias circuits 15—designated $15_1, 15_2, \ldots, 15_{32}$. Each slave bias circuit $15_{i+32}$ has an output terminal O driving input terminal I of the fine delay buffer $17_i$ (i varies from 1 to 32). FIG. 1 shows 3 such slave bias circuits, $15_{33}, 15_{34}$ and $15_{64}$. For example, as seen in FIG. 1, output terminal O of slave bias circuit $15_{33}$ drives input terminal C of fine delay buffer $17_1$, output terminal O of slave bias circuit $15_{34}$ drives input terminal C of fine delay buffer $17_2$, etc. Input terminal I of each slave bias circuit 15 receives signal VQ generated at output terminal O of phase detector 14.

TDC 10 further includes 32 8-bit registers—designated $18_1, 18_2, \ldots, 18_{32}$ of which, namely registers $18_1, 18_2$ and $18_{32}$, are shown in FIG. 1. Signal CLK is applied to the clock input terminal C of all registers 18.

Figure 7:
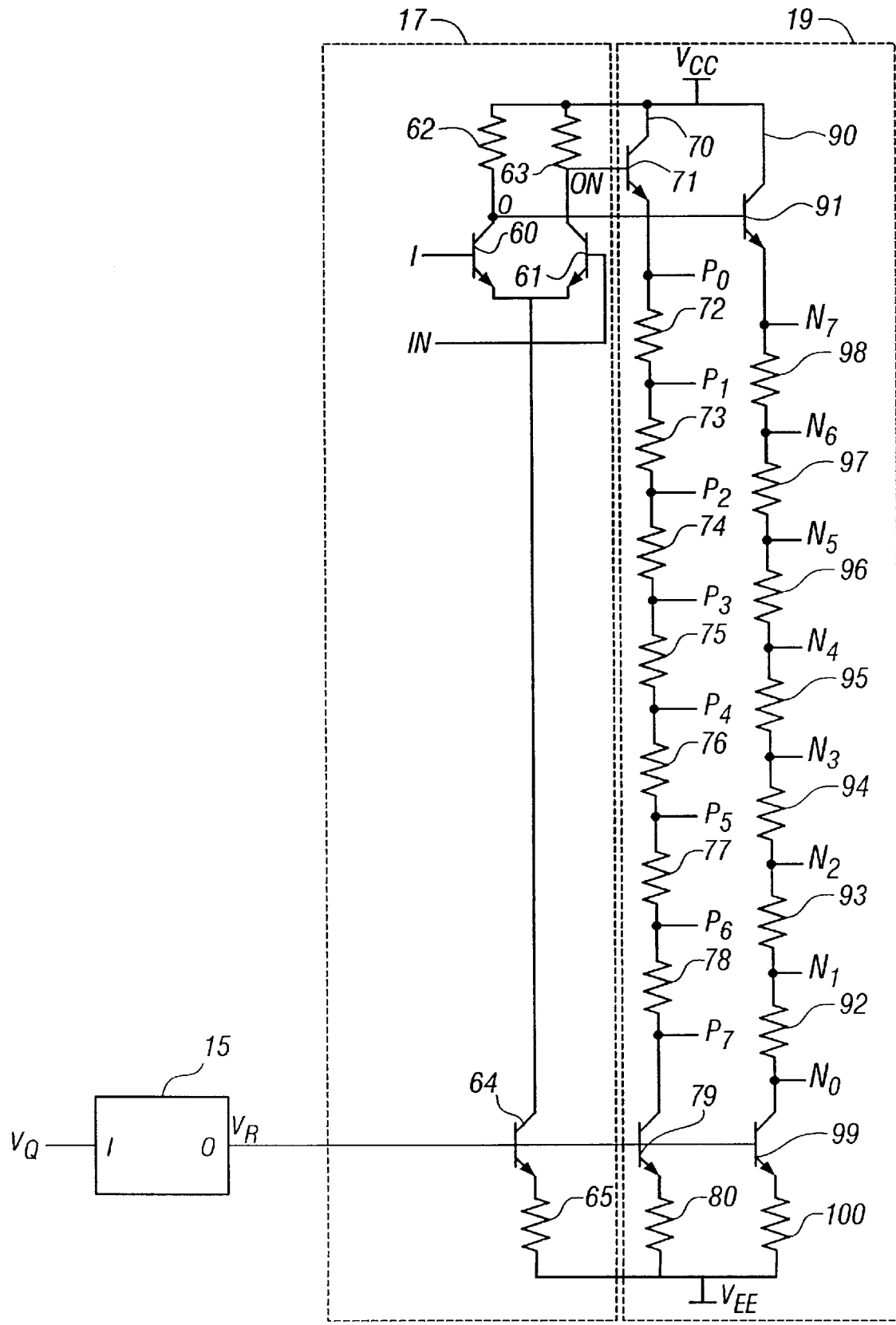
FIG. 7 shows a transistor-resistor schematic diagram of a fine delay path, in accordance with one embodiment.

TDC 10 further includes 32 fine delay paths—designated $19_1, 19_2, \ldots, 19_{32}$ of which, namely fine delay paths $19_1, 19_2$ and $19_{32}$, are shown in FIG. 1. Each fine delay path $19_i$ is coupled to the 8-bit register $18_i$ and to the fine delay buffer $17_1$. For simplicity, in FIG. 1, each fine delay path $19_1$ is shown as having 7 fine delay stages 20 and 8 nodes 27 each of which is coupled to a different one of the input bits 0–7 of register $18_i$. A schematic diagram of each fine delay path 19 is shown in FIG. 7 and described below. As shown in FIG. 1, for example, each of the 8 nodes 27 of fine delay path $19_1$, is coupled to a different one of the input bits 0–7 of register $18_1$; each of the 8 nodes 27 of delay path $19_{32}$ is coupled to a different one of the input bits 0–7 of register $18_{32}$.

Input terminal I of each fine delay path $19_i$ is driven by output terminal O of the fine delay buffer $17_i$. For example, input terminal I of fine delay path $19_1$ is driven by output terminal O of fine delay buffer $17_1$, input terminal I of fine delay path $19_{32}$ is driven by output terminal O of fine delay buffer $17_{32}$.

TDC 10 also includes 32 registered priority encoders—designated $21_1, 21_2, \ldots, 21_{32}$ of which, namely registered priority encoders $21_1$, $21_2$ and $21_{32}$, are shown in FIG. 1. Each registered priority encoder $21_i$ is coupled to and receives an 8-bit signal from the register $18_i$. For example, registered priority encoder $21_1$ is coupled to and receives the 8-bit signal supplied by register $18_1$; registered priority encoder $21_{32}$ is coupled to and receives the 8-bit signal supplied by register $18_{32}$. Each registered priority encoder 21 supplies a 3-bit signal at its output terminals O0, O1 and O2.

TDC 10 also includes 2-input AND gate 23 whose normal input terminal I0 receives signal EDGE and whose inverted input terminal I1 is coupled to output terminal O of fine delay buffer $17_{32}$.

TDC 10 further includes delay encoder 22 which has 97 input terminals $I_0$–$I_{96}$ and 9 output terminals $O_0$–$O_8$. Delay decoder 22 receives the output signal supplied by AND gate 23 and generates at its output terminal $O_8$ signal EDGE_FLAG. Signal EDGE_FLAG is set when a transition on signal EDGE is detected. Delay encoder 22 also receives the 3-bit signal generated by each of the 32 registered priority encoders 21 and in response thereto generates at its output terminals $O_0$–$O_7$ signal TIME_STAMP which displays the arrival time with respect to signal CLK of the detected transition on signal EDGE.

It is understood below that signals EDGE and CLK are both differential signals each consisting of a differentially high and a differentially low signal (not shown in FIG. 1). Accordingly, the signals received and generated by each of the coarse delay stages 12 in delay paths 13 and 16, fine delay paths 19, fine delay buffers 17 and registers 18 are also differential. Other embodiments of the present disclosure may or may not use differential signals. The operation of TDC 10 is described next.

The delay through delay path 13 is selected so as to be equal to one period of signal CLK. Consequently, signal CLK_delay lags signal CLK by one period of signal CLK. Signals CLK and CLK_delay are maintained in phase by a conventional phase detector 14.

When signals CLK and CLK_delay are in phase, voltage signal VQ is maintained at its center value (i.e., the value signal VQ has when signals CLK and CLK_delay are in phase). Phase detector 14 varies the voltage level of signal VQ as it detects a mismatch between the phases of signals CLK and CLK_delay. Each slave bias circuit 15 varies the voltage level of signal VR it generates in response to the variations in the voltage level of signal VQ thus modifying the delay through its associated coarse delay stage 12 in delay path 13 to thereby force the phases of signals CLK and CLK_delay to match.

Each slave bias circuit 15 by receiving signal VQ and generating signal VR reduces the amount of capacitive load that signal VQ would otherwise have to drive. Each slave bias circuit 15 also isolates the fine delay buffer 17—to which it is coupled—from phase detector 14, thereby minimizing the amount of noise that is injected on to signal VQ.

If signal CLK leads signal CLK_delay in phase, the voltage level of signal VQ—and thus that of signals VR—increases from its center value to decrease the delay across delay path 13 to thereby bring the two signals in phase. If signal CLK lags signal CLK_delay in phase, the voltage level of signal VQ—and thus that of signals VR—decreases from its center value to increase the delay across delay path 13 to thereby bring the two signals in phase.

The time delay through delay path 16 is equal to one period of signal CLK for the following reasons. First, delay paths 13 and 16 each include 32 identical course delay stages 12 connected in series. Second, the delay through each coarse delay stage 12 is controlled by an identical slave bias circuit 15, each of which receives voltage signal VQ and generates voltage signal VR. In other words, slave bias circuits 15 collectively force the delay through each coarse delay stage 12 in both delay paths 13 and 16 to be substantially the same. Third, the physical layout (not shown) of each coarse delay stage 12 in delay path 13 is identical to that in delay path 16. Furthermore, as seen from FIG. 1, coarse delay stage $12_{33}$ is coupled to output terminal O of coarse delay stage $12_{32}$ so that the amount of load seen by—and hence the delay through—coarse delay stage $12_{32}$ in delay path 16 matches that seen by coarse delay stage $12_{32}$ in delay path 13.

As a transition on signal EDGE propagates through each coarse delay stage 12 in delay path 16, it also propagates through each fine delay buffer 17 and further through each of the fine delay paths 19 to arrive at the input terminals (i.e., input bits) of 8-bit registers 18. The extent of propagation of the transition on signal EDGE through coarse delay path 16 as well as through fine delay paths 19 is determined by the arrival time of the transition on signal EDGE with respect to the subsequent occurrence of a transition on signal CLK. The longer the time period between the transitions on signals EDGE and CLK, the greater is the extent of propagation of the transition on signal EDGE through the coarse delay path 16 and the fine delay paths 19.

As seen from FIG. 1, a transition on signal EDGE, after propagating through e.g. coarse delay stage 12, in delay path 16 and through fine delay buffer $17_1$, appears at input bits 0–7, respectively, of register $18_1$. Each fine delay path 19 is selected such that the delay therethrough matches the delay across a single coarse delay stage 12. Accordingly, two different registers $18_i$ and $18_j$ receive the delayed transition on signal EDGE at their same input terminals after a time period equal to the delay through (j–i) coarse delay stages 12. For example, the time elapsed between the arrival of a transition on signal EDGE at e.g. input bits 6 of e.g. registers $18_3$ and $18_5$ is equal to the delay through two (i.e., 5–3) coarse delay stages 12 (i.e., the delay through coarse delay stages $12_4$ and $12_5$ of delay path 16—not shown in FIG. 3).

Consequently, depending on the arrival time of a transition on signal EDGE with respect to signal CLK, and depending on the position of a register. 18 along signal EDGE's travel in TCD 10, all, some or none of the input bits of that register 18 may receive the delayed transition on signal EDGE.

A binary 1 is stored at a register 18's input bit if the transition on signal EDGE appears at that bit's input terminal before a low to high (or a high to low) transition appears on signal CLK. In contrast, a binary 0 is stored at a register 18's input bit if the transition on signal EDGE does not appear at that bit's input terminal before a low to high (or a high to low) transition appears on signal CLK.

Therefore, in accordance with this embodiment, depending on the extent of the propagation of a transition on signal EDGE, one of the following two situations might occur. First, all of the registers 18 in TDC 10 may contain either a '11111111'—'FF' in hexadecimal or hex—or a '00000000'—'00' in hex—. Second, one of the registers 18 contains a binary value other than hex 'FF' or '00', while all the other registers 18 contain either hex 'FF' or '00'. In the first case, the highest indexed register 18 containing hex 'FF' records the extent of the propagation of the transition on signal EDGE through coarse delay path 16 and fine delay paths 19. In the second case, the register 18 containing a hex value other than hex 'FF' or '00' records the extent of the propagation of the transition on signal EDGE through coarse delay path 16 and fine delay paths 19.

Assume, for example, that a transition on signal EDGE propagates through coarse delay stages $12_1$, $12_2$ and $12_3$ of delay path 16 as well as through all 8 nodes 27 of fine delay paths $19_1$, $19_2$ and $19_3$ before the arrival of the next CLK transition signal. In other words, signal EDGE transition arrives at all 8 input bits of registers $18_1$, $18_2$ and $18_3$ but does not propagate to any of the input bits of the subsequent register $18_4$, before the subsequent arrival of the next CLK signal transition. Accordingly, registers $18_1$, $18_2$ and $18_3$ each store hex 'FF' while registers $18_4$–$18_{32}$ each store hex '00'. In other words, in the above example, the transition on signal EDGE propagates to bit 7 (i.e., the $8^{th}$ bit) of register $18_3$ but fails to reach bit 0 of register $18_4$, before the arrival of the next CLK signal. Accordingly, register $18_3$ records and is thus the identifier of the arrival time of the transition on signal EDGE.

For another example, assume that a transition on signal EDGE reaches to all the 8 input bits of registers $18_1$, $18_2$ and $18_3$, as well as to input bits 0, 1, 2, 3, 4 of register $18_4$, but does not reach to input bits 5, 6, 7 of register $18_4$. Accordingly, registers $18_1$, $18_2$ and $18_3$ each store hex 'FF', register $18_4$ stores binary '00011111'—or hex 'FF'—while all other remaining registers $18_5$–$18_{32}$ store hex '00'. Therefore, in this example, register $18_4$ records and is thus the identifier of the arrival time of the transition on signal EDGE.

As seen from FIG. 1, each register $18_i$ supplies its stored binary data to the registered priority encoder $21_i$. For example, register $18_2$ supplies its stored binary data to registered priority encoder $21_2$ and register $18_{32}$ supplies its stored binary data to registered priority encoder $21_{32}$. Each registered priority encoder 21 includes a combinatorial priority encoder whose 3-bit output signal is stored in the registered priority encoder's 3-bit register (see FIG. 5). Priority encoders are well known in the art. A priority encoder implements a priority function such that if two or more of its input signals are equal to 1 at the same time, the input having the highest positional significance is assigned precedence in generating the encoder's output signal. Table I below shows the truth table implemented by each registered priority encoder 21.

TABLE I

| INPUT | | | | | | | | OUTPUT | | |
|---|---|---|---|---|---|---|---|---|---|---|
| $I_0$ | $I_1$ | $I_2$ | $I_3$ | $I_4$ | $I_5$ | $I_6$ | $I_7$ | $O_0$ | $O_1$ | $O_2$ |
| 0 | 0 | 0 | 0 | 0 | 0 | 0 | 0 | 0 | 0 | 0 |
| 1 | 0 | 0 | 0 | 0 | 0 | 0 | 0 | 0 | 0 | 0 |
| X | 1 | 0 | 0 | 0 | 0 | 0 | 0 | 0 | 0 | 1 |
| X | X | 1 | 0 | 0 | 0 | 0 | 0 | 0 | 1 | 0 |
| X | X | X | 1 | 0 | 0 | 0 | 0 | 0 | 1 | 1 |
| X | X | X | X | 1 | 0 | 0 | 0 | 1 | 0 | 0 |
| X | X | X | X | X | 1 | 0 | 0 | 1 | 0 | 1 |
| X | X | X | X | X | X | 1 | 0 | 1 | 1 | 0 |
| X | X | X | X | X | X | X | 1 | 1 | 1 | 1 |

In accordance with Table I, if bit 7 (the most significant bit or MSB) of a register $18_i$ is 1, output signals $O_0$, $O_1$, $O_2$ of the registered priority encoder $21_i$ are all equal to 1. If, however, bit 0 (the least significant bit or LSB) of a register $18_i$ is 0, output signals $O_0$, $O_1$, $O_2$ of the registered priority encoder $21_i$ are all equal to 0. Accordingly, a binary value of '111' at the output terminals of a registered priority encoder $21_i$ indicates the arrival and subsequent store of the transition on signal EDGE by all input bits 0–7 of the register $18_i$. In contrast, a binary value of '000' at the output terminals of a registered priority encoder $21_i$ indicates a transition on signal EDGE that failed to reach the LSB of the register $18_i$. If a register $18_i$ stores a value other than hex 'FF' or '00', the registered priority encoder $21_i$ provides a binary value other than '111' or '000' at its output terminals, in accordance with Table I.

Consequently, if each register $18_i$ stores either a hex 'FF' or '00', the highest indexed registered priority encoder 21 having a binary output value '111' is the identifier of the arrival time—with respect to signal CLK—of the transition on signal EDGE. If, on the other hand, a register $18_i$ stores a hex value other than 'FF' or '00', registered priority encoder $21_i$ is the identifier of the arrival time—with respect to signal CLK—of a transition on signal EDGE. For example, assume that registered priority encoders $21_1$–$21_4$ each have a binary output value of '111' and that registered priority encoders $21_6$–$21_{32}$ each have a binary output value of '000'. Assume further that registered priority encoder $21_5$ has a binary output value of e.g. '101'. Consequently, the arrival time—with respect to signal CLK—of the transition on signal EDGE is identified by registered priority encoder $21_5$.

The output signals of each of the 32 registered priority encoders 21 are supplied to delay encoder 22, which has 97 input terminals, $I_0$–$I_{96}$ and 9 output terminals $O_0$–$O_8$. The 8 bits of signal TIME_STAMP are supplied by output terminals $O_0$–$O_7$ of delay encoder 22. The output signal supplied by AND gate 23 is transferred to signal EDGE_FLAG appearing at output terminal $O_8$ of delay encoder 22.

Figure 9:
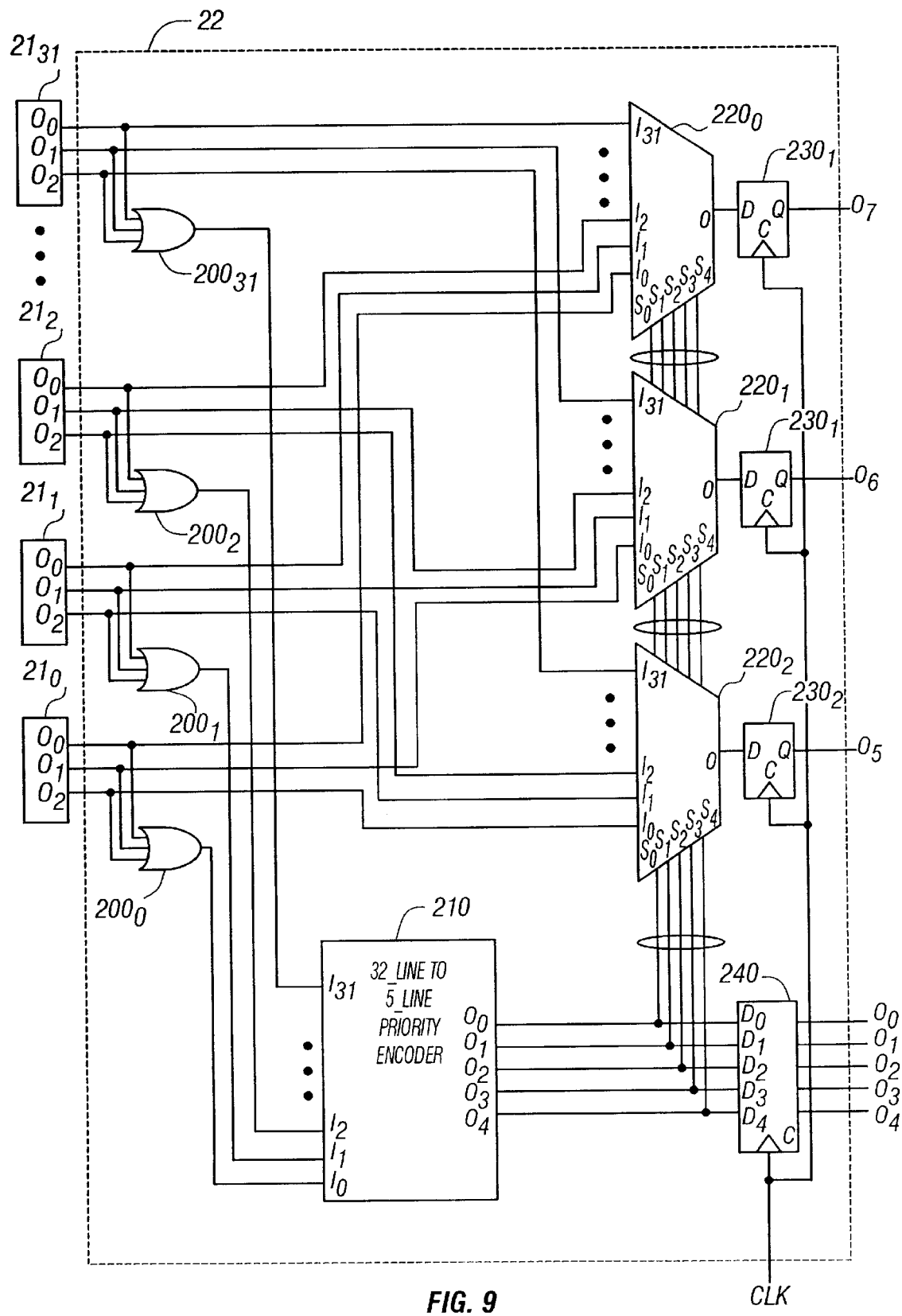
FIG. 9 shows a logic block diagram of a delay encoder, in accordance with one embodiment.

A logic block diagram of delay encoder 22 is shown in FIG. 9. Delay encoder 22 includes thirty two 3-input OR gates $200_0$–$200_{31}$, a 32-bit to 5-bit priority encoder 210, three multiplexers 220, three 1-bit registers $230_0$–$230_2$, and a 5-bit register 240. Each OR gate $200_i$ receives input signals from the registered priority encoder $21_i$. The output signal of each OR gate 200 is applied to a different one of the 32 input terminals of priority encoder 210. The output terminals of the priority encoder 210 are applied to the select terminals $S_0$, $S_1$, $S_2$, $S_3$, $S_4$ of multiplexeres $220_0$, $220_1$, and $220_2$ whose Output terminals are respectively applied to data terminals D of registers $230_0$, $230_1$, and $230_2$. The 5 Output terminals of priority encoder 210 are applied to the data terminals $D_0$–$D_4$ of the 5-bit register 240. The Q output terminals of register $230_0$, $230_1$, and $230_2$ respectively supply signals to output terminal $O_7$, $O_6$ and $O_5$ of priority encoder 22. The output terminals of register 240 supply signals to output terminals $O_0$–$O_4$ of priority encoder 22. Delay encoder 22 provides the index number and the output signals of the registered priority encoder 21 which, in accordance with the above, is the identifier of the arrival time of the transition on signal EDGE. The index number of the identifier registered priority encoder 21 is supplied to output terminals $O_0$–$O_4$ of delay encoder 22, while the output signals of the identifier registered priority encoder 21 are supplied to output terminals $O_5$–$O_7$ of delay encoder 22. Examples of the operation of delay encoder 22 follow.

Suppose that each registered priority encoder $21_1$–$21_4$ encodes (i.e., generates) binary '111' while each registered priority encoder $21_5$–$21_{32}$ encodes '000'. Accordingly, delay encoder 22 supplies binary '00100'—the binary index of the highest indexed priority encoder 21 having output signals '111'—at its output terminals $O_0$–$O_4$. The binary output signals of priority encoder $21_4$—'111'—appear at output signals $O_5$–$O_7$ of delay encoder 22. Accordingly, in the above example, signal TIME_STAMP has a binary value of '00100111'. Consequently, in accordance with this example, the transition on signal EDGE arrived $$\left(\frac{39}{256} * \text{period of the signal } CLK\right)$$

prior to the occurrence of the subsequent transition on CLK signal. Advantageously, as seen from this example, TDC 10 of present disclosure records the arrival time of a transition on signal EDGE with a resolution equal to $$\frac{1}{256}$$

of the clock period.

For another example, assume that registered priority encoder $21_7$ (not shown in FIG. 1) encodes '101' while each registered priority encoder $21_1$–$21_6$ encodes '111' and each registered priority encoder $21_8$–$21_{32}$ encodes '000'. Accordingly, signal TIME_STAMP has a binary value '00111101', the 5 most significant bits of which have a binary value of 7 (i.e., the index of priority encoder $21_7$), and the 3 least significant bits of which display the binary output signals of registered priority encoder $21_7$. Consequently, in this example, the transition on signal EDGE arrived $$\left(\frac{61}{256} * \text{period of the signal } CLK\right)$$

prior to the occurrence of the subsequent transition on CLK signal.

While signal TIME_STAMP displays the arrival time of a transition on signal EDGE, signal EDGE_FLAG supplied on output terminal $O_8$ of delay encoder 22 detects the occurrence of a transition on signal EDGE.

Referring to FIG. 1, 2-input AND gate 23 receives signal EDGE at its normal input terminal I0 and the signal generated at output terminal O of fine delay buffer $17_{32}$ at its inverted input terminal $I_1$. AND gate 23 detects the occurrence of transitions on signal EDGE and supplies the detected transitions to input terminal $I_{96}$ of delay encoder 22, as described below.

When signal EDGE undergoes e.g. a low-to-high level transition, the high level signal—caused by the transition—is immediately supplied to input terminal I0 of AND gate 23. The high level signal, however, must propagate through the delay path 16 as well as through fine delay buffer $17_{32}$ before reaching input terminal $I_1$ of AND gate 23. Accordingly, since inverted input terminal $I_1$ of AND gate 23 receives the high level signal after a time period set by the delay through delay path 16 and delay buffer $17_{32}$ while normal input terminal $I_0$ of AND gate 23 receives the high level before this time period, output signal O of AND gate 23 changes from 0 to 1, indicating the occurrence of a low-to-high transition on signal EDGE. When the high level transition eventually reaches terminal $I_1$ of AND gate 23, the output signal of AND gate 23 reverts back to 0.

As seen from FIG. 1, clock signal CLK is applied to the clock input terminals C of each of the registers 18, registered priority encoders 21 and delay encoder 22.

On the first low-to-high transition of signal CLK—following a low-to-high transition on signal EDGE—the signals present on the input bits of each register 18 are stored and are thus supplied to that register 18's associated registered priority encoder 21.

On the second low-to-high transition of signal CLK—following the low-to-high transition on signal EDGE—the signals encoded by the combinatorial logic (i.e., the logic implementing the priority function) of each of the registered priority encoders 21 are stored in the priority encoder's 3-bit register and are thus supplied to the input terminals $I_0$–$I_{95}$ of delay encoder 22. Prior to the occurrence of the second transition on signal CLK, AND gate 23 supplies the detected transition on signal EDGE to input terminal $I_{96}$ of delay encoder 22.

On the third transition of signal CLK—following the low-to-high transition on signal EDGE—the 8-bit signal TIME_STAMP along with signal EDGE_FLAG are respectively supplied to output terminals $O_0$–$O_7$ and $O_8$ of delay encoder 22. In other words, on the third transition of signal CLK following a low-to-high (or a high-to-low) transition on signal EDGE, signal EDGE_FLAG detects the occurrence of the transition on signal EDGE and signal TIME_STAMP supplies the arrival time of the detected transition with respect to signal CLK.

Figure 2:
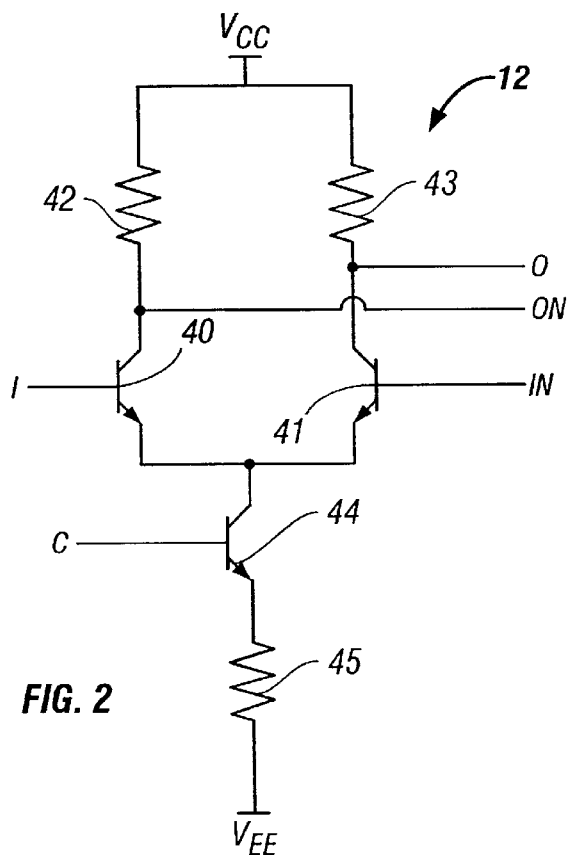
FIG. 2 is a transistor schematic diagram of a coarse delay stage, in accordance with one embodiment.

FIG. 2 shows a schematic diagram of known coarse delay stage 12 as used in delay paths 13 and 16. Each delay stage 12 receives a pair of differential signals at its input terminals I and $I_N$ and generates a pair of differential signals at its output terminals O and $O_N$.

The base terminals of bipolar transistors 40, 41 are respectively coupled to terminals I and $I_N$. The collector terminals of transistors 40, 41 are respectively coupled to a first terminal of each resistor 42 and 43. A second terminal of each resistor 42 and 43 is coupled to supply voltage Vcc. The emitter terminals of transistors 40 and 41 are coupled to the collector terminal of bipolar transistor 44. The emitter terminal of transistor 44 is coupled to a first terminal of resistor 45 whose second terminal is coupled to supply voltage $V_{EE}$. The delay between the differential signals applied to input terminals I, $I_N$ and the differential signals generated at output terminals O, $O_N$ of each coarse delay stage 12 is controlled by the voltage signal applied to the base terminal of transistor 44, which base is coupled to input terminal C of coarse delay stage 12.

Figure 3:
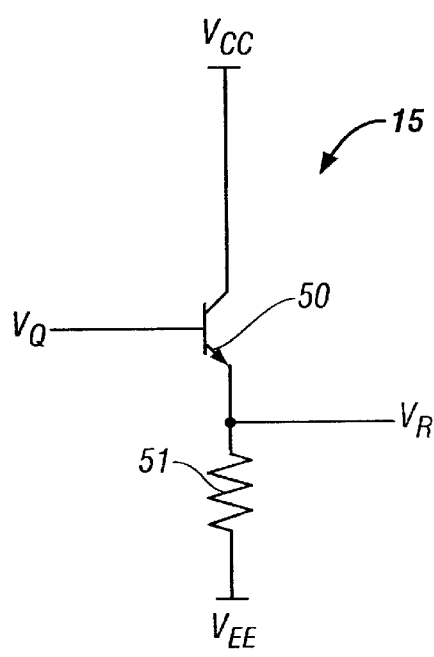
FIG. 3 is a transistor schematic diagram of a slave bias circuit, as known in the prior art.

FIG. 3 shows a schematic diagram of each slave bias circuit 15. Slave bias circuit 15 which is known in the prior art, includes bipolar transistor 50 and resistor 51. Slave bias circuit 15 which is commonly known as an emitter-follower amplifier, receives signal VQ at the base terminal of transistor 50 and generates voltage signal VR at its emitter terminal. Signal VR has a voltage level that is lower than that of signal VQ by the base-to-emitter voltage (i.e., Vbe) of transistor 50.

Referring simultaneously to FIGS. 1–3, the voltage level of signal VR at the emitter terminal of transistor 50 follows the voltage level of signal VQ applied to the base terminal of transistor 50. Accordingly, voltage increases or decreases of signal VQ are followed by similar increases or decreases of signal VR. Thus, if e.g. signal CLK lags signal CLK_delay in phase, the ensuing reduction by phase detector 14 in the voltage level of signal VQ is also experienced by signal VR. The reduction of the voltage level of signal VR—which is applied to input terminal C of coarse delay stage 12 of FIG. 2—reduces the base-to-emitter voltage of transistor 44 of FIG. 2, thereby causing a corresponding decrease in the current flow through each delay stage 12. The decrease in the current flow through delay stages 12 increases the delay through delay paths 13 and 16. In other words, assuming signal CLK initially lags signal CLK_delay, a reduction in the total current flow through each coarse delay stage 12 increases the delay between the time at which the signals are applied to input terminals I, $I_N$ and the time at which the signals are generated at output terminals O, $O_N$ of each coarse delay stage 12, thereby bringing signals CLK and CLK_delay in phase.

Similarly, if signal CLK initially leads signal CLK_delay in phase, the voltage levels of signals VQ and VR increase, causing an increase in the current flow through each coarse delay stage 12 which thereby reduces the delay through each coarse delay stage 12, thus equalizing the phases of signals CLK and CLK_delay.

Figure 4:
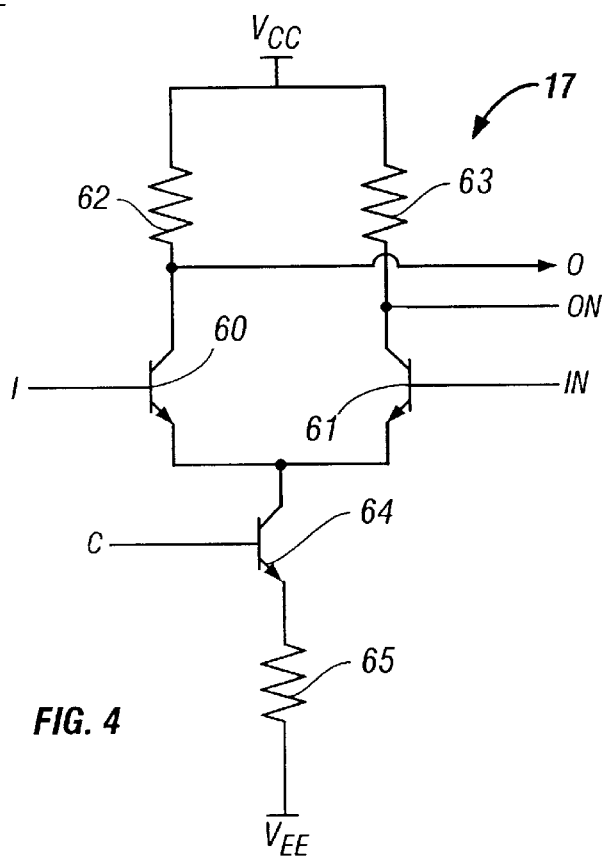
FIG. 4 is a transistor schematic diagram of a fine delay buffer, in accordance with one embodiment.

FIG. 4 shows a transistor schematic diagram of each fine delay buffer 17, as known in the prior art. Each fine delay buffer 17 includes resistors 62, 63, 64, transistors 60, 61, 64 coupled to supply voltages Vcc and VEE. Resistor 62 is coupled across supply voltage VCC and the collector terminal of transistor 60. Resistor 63 is coupled across supply voltage VCC and the collector terminal of transistor 61. The base terminals of transistors 48 and 50 are respectively coupled to input terminals I and $I_N$ of fine delay buffer 17. The emitter terminals of transistors 60 and 61 are coupled to the collector terminal of transistor 62 which has a base terminal for receiving signal VR and an emitter terminal which is coupled to a first terminal of resistor 65. A second terminal of resistor 54 is coupled to supply voltage VEE.

Signal VR by controlling the base voltage of transistor 64 varies the amount of current that flows through the emitter-coupled pair fine delay buffer 17 and thus controls the gain of and the delay through fine delay buffer 17. The greater the voltage level of signal VR, the greater is the gain of fine delay buffer 17 and thus the smaller is the time elapsed between the voltage transitions of differential signals applied to input terminals I, $I_N$ and those of differential signals generated at output terminals O, $O_N$.

Figure 5:
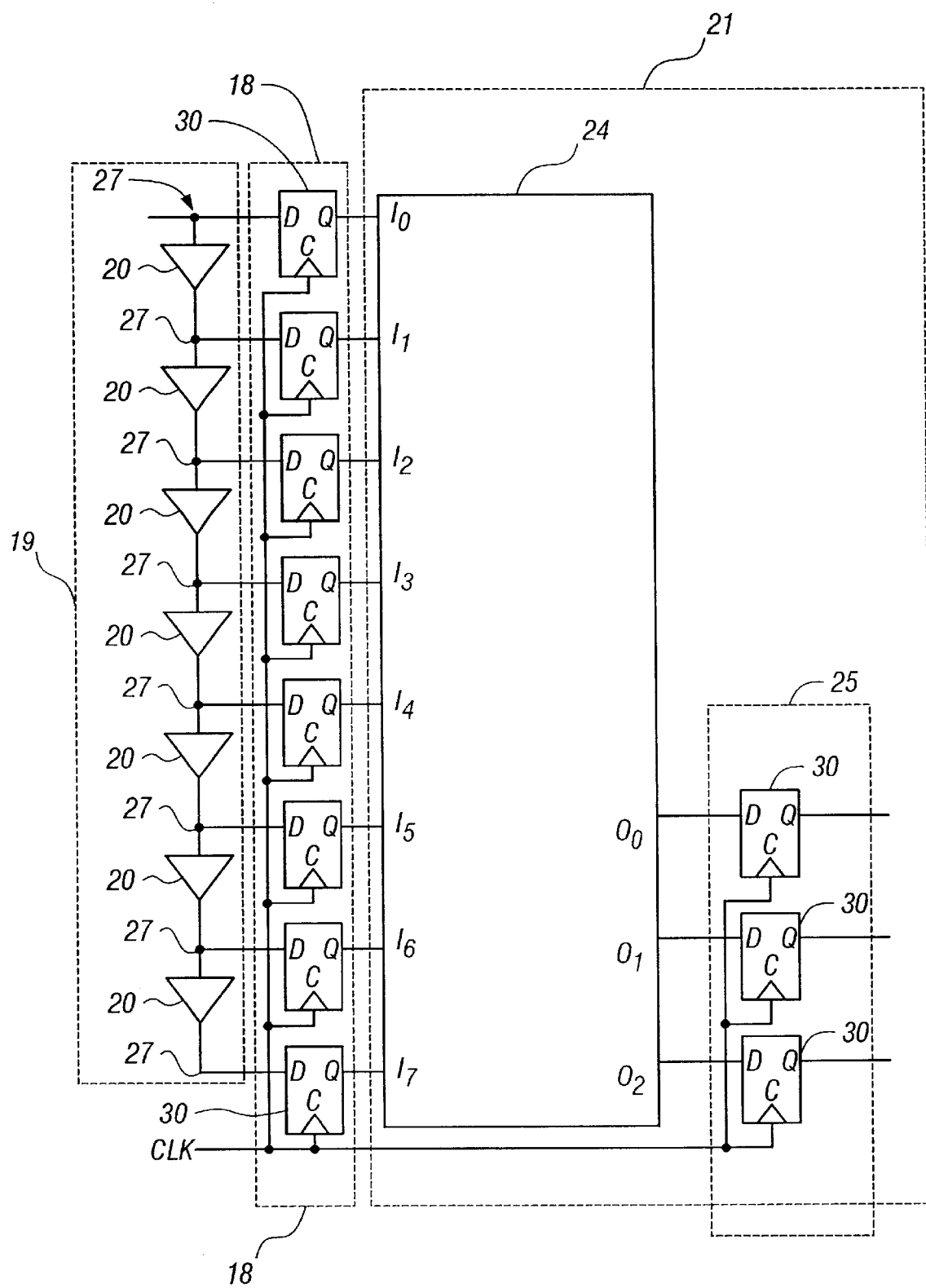
FIG. 5 is an enlarged block diagram of a section of the time-to-digital converter of FIG. 1.

FIG. 5 shows an enlarged simplified view of a delay path 19, coupled to an 8-bit register 18 which, in turn, is coupled to a registered priority encoder 21. FIG. 5, as in FIG. 1, does not show the use of differential signals and thus therein each delay path 19 is shown as having 7 fine delay stages 20 and 8 nodes 27 each coupled to a different input terminal of the 8-bit register 18. A more detailed schematic diagram of each fine delay buffer 19 is shown in FIG. 7.

Figure 6:
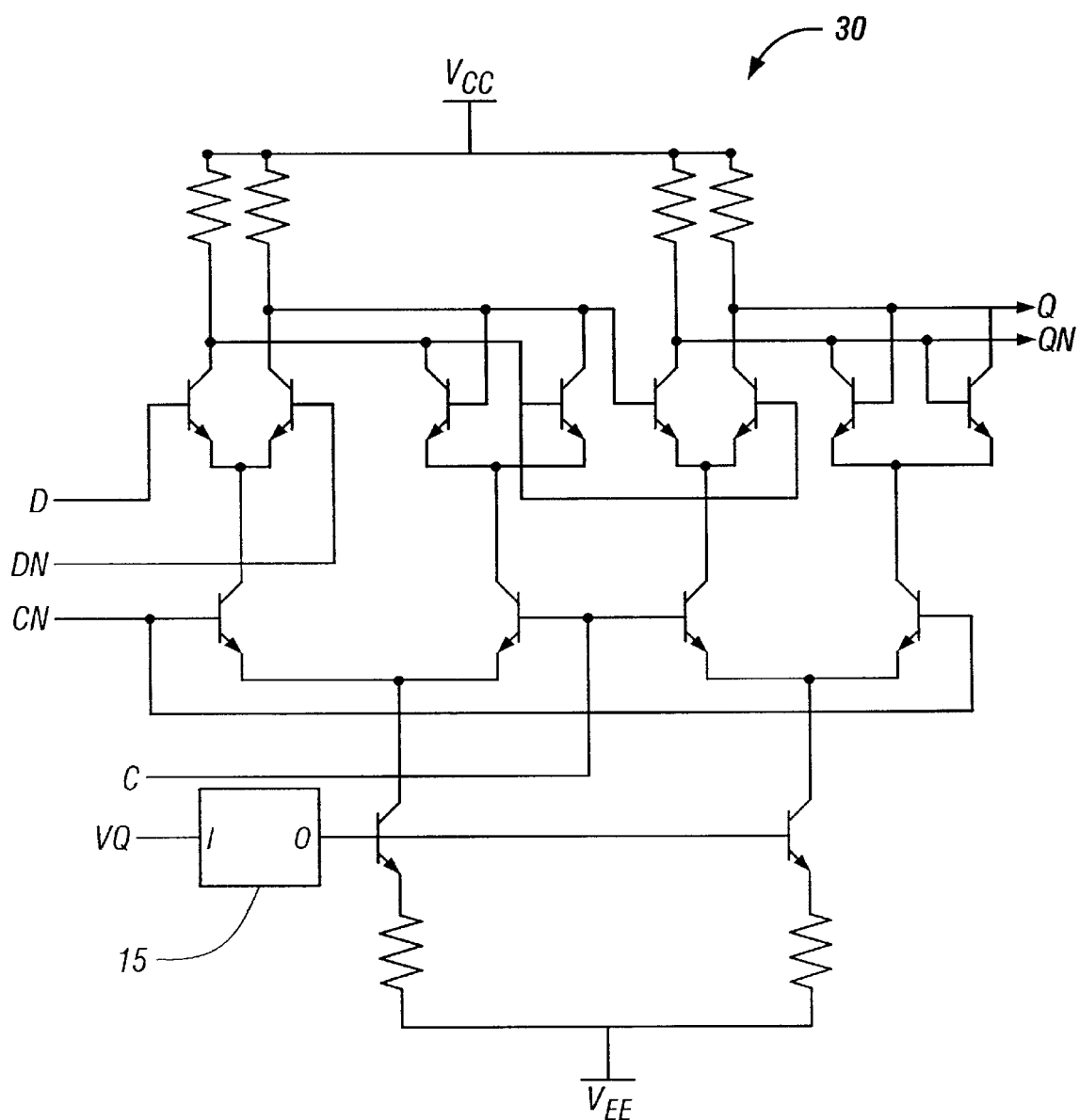
FIG. 6 is a transistor schematic diagram of an Emitter Coupled Logic register, as known in the prior art.

Each 8-bit register 18 includes 8 known one-bit ECL (Emitter-Coupled Logic) register 30 (shown in greater detail in FIG. 6). For simplicity, each ECL register 30 in FIG. 5 is shown as having single data D, clock C and output Q terminals. However, as seen from FIG. 6, each of D, C and Q terminals of ECL register 30 includes two terminals each for receiving a differentially high or a differentially low signal. Furthermore, because the data input terminals D and $D_n$, of each ECL register 30 receive a pair of differential signals, each node 27 in fine delay path 19 of FIG. 5 (and FIG. 1) also includes a pair of nodes (not shown in FIG. 5), one supplying a differentially low (or high) signal to terminal D and the other supplying a differentially high (or low) signal to terminal $D_N$, as described in more detail below in connection with FIG. 7.

Referring to FIG. 5, each registered priority encoder 21 includes a combinatorial logic 24 which performs the priority encoding function—in accordance with Table 1 above—and a 3-bit register 25. Each 3-bit register 25 includes three 1-bit ECL registers 30. Output terminals $D_0$, $D_1$, $D_2$ of combinatorial logic 24 respectively supply signals to bits 0, 1 and 2 of register 25. Signal CLK supplies a clock signal to clock input terminal C of each ECL register 30 of each register 25. Note that in FIG. 5 each of the signals supplied at output terminals $O_0$, $O_1$ and $O_2$ of combinatorial logic 24 is a differential signal but is not shown as such for simplicity.

FIG. 6 shows a transistor schematic diagram of known ECL register 30, as used in each 8-bit register 18 and in each 3-bit register 25 of registered priority encoder 21 (see FIG. 5). Note that ECL register 30 operates differentially and thus includes a pair of data terminals (D, DN), a pair of clock terminals (C CN), and a pair of output terminals (Q, QN). Signal VQ (not shown in FIGS. 1 and 5) controls the gain and thus the speed of operation of ECL register 30. Some embodiments of ECL register 30 may include known slave bias circuit 15, as shown in FIG. 6, to increase the fanout of signal VQ. The operation of ECL register 30 is known to those skilled in the art.

FIG. 7 shows a transistor schematic diagram of a fine delay path 19 coupled to a fine delay buffer 17 and slave bias 15. Each fine delay path 19 includes two resistor-transistor legs 70 and 90 (hereinafter referred to as legs 70 and 90). Leg 70 includes, among other components, resistor 72 connected across nodes $P_0$ and $P_1$ (the subscript of each node, i.e., 0, 1, . . . refers to the node's index number), resistor 73 connected across nodes $P_1$ and $P_2$, resistor 74 connected across nodes $P_2$ and $P_3$, resistor 75 connected across nodes $P_3$ and $P_4$, resistor 76 connected across nodes $P_4$ and $P_5$, resistor 77 connected across nodes $P_5$ and $P_6$ and resistor 78 connected across nodes $P_6$ and $P_7$. Leg 70 also includes bipolar transistors 71 and 79 and resistor 80. The collector, base and emitter terminals of transistor 71 are respectively coupled to supply voltage Vcc, to output terminal $O_N$ of delay buffer 17 and to node $P_0$. The base terminal of transistor 79 receives signal VR of slave bias 15 (also see FIG. 1). The collector and emitter terminals of transistor 79 are respectively coupled to node $P_7$ and to a first terminal of resistor 80. The second terminal of resistor 80 is coupled to supply voltage VEE.

Leg 90 includes among other components, resistor 92 connected across nodes $N_0$ and $N_1$, resistor 93 connected across nodes $N_1$ and $N_2$, resistor 94 connected across nodes $N_2$ and $N_3$, resistor 95 connected across nodes $N_3$ and $N_4$, resistor 96 connected across nodes $N_4$ and $N_5$, resistor 97 connected across nodes $N_5$ and $N_6$ and resistor 98 connected across nodes $N_6$ and $N_7$. Leg 400 also includes bipolar transistors 91, 99 and resistor 100. Resistors 72–78 of leg 70 and resistors 92–98 of leg 90 each have the same resistance. The collector, base and emitter terminals of transistor 91 are respectively coupled to supply voltage Vcc, to output terminal O of delay buffer 17 and to node $N_7$. The base terminal of transistor 99 receives signal VR from slave bias 15. The collector and emitter terminals of transistor 99 are respectively coupled to node $N_0$ and to a first terminal of resistor 100. The second terminal of resistor 100 is coupled to supply voltage VEE. As stated above, for simplicity, each two nodes having the same index in legs 70 and 90 are shown in FIGS. 1 and 5 as a single node 27. For example, nodes $P_0$ and $N_0$ are shown as a single node 27; similarly e.g. node $P_5$ and $N_5$ are shown as another single node 27 in FIGS. 1 and 5.

Nodes $P_0$–$P_7$ of leg 70 of each fine delay path $19_i$ are respectively coupled to input bit terminal D of a different one of the ECL registers 30 of register $18_i$ (see FIGS. 1, 5, 6 and 7). For example, node $P_0$ of fine delay path 19, is coupled to D input terminal of the ECL register 30 forming bit 0 of register $18_1$; node $P_7$ of fine delay path $19_1$, is coupled to D input terminal of the ECL register 30 forming bit 7 of register $18_1$. Similarly, nodes $N_0$–$O_7$ of leg 90 of each fine delay path $19_i$ are respectively coupled to input terminal $D_N$ of a different one of the ECL registers 30 of register $18_i$. Nodes having the same index in legs 70 and 90 (e.g., nodes $P_0$ and $N_0$) are coupled to the differential input terminals of the same ECL register 30. Accordingly, node pairs $(N_0, P_0),(N_1, P_1) \ldots (N_7, P_7)$ of e.g. fine delay path $19_i$, are respectively coupled to (D, $D_N$) input terminals of ECL registers 30 of respectively bits 0–7 of register $18_1$. As stated above, to simplify the drawings, FIGS. 1 and 5 do not show the differential signals provided by similarly indexed nodes driving differential data input terminals D and $D_N$ of their corresponding ECL register 30. FIGS. 1 and 5 show each node pair as a single node 27 driving a single data input terminal of a register bit.

Each pair of resistors connected across similarly indexed nodes in legs 70 and 90 (e.g., resistors 72 and 92, both of which are connected across nodes with indices 0 and 1), form a fine delay stage—shown as a delay stage 20 in FIGS. 1 and 5. The delay across each fine delay stage is determined by the difference between the time when the voltages of nodes ($P_i$, $N_i$) reach the same level and the time when the voltages of nodes ($P_{I+1}$, $N_{I+1}$) reach the same level.

Referring to FIG. 7, transistor 64 of fine delay buffer 17 as well as transistors 79 and 99 of fine delay path 19 each receive the same voltage signal VR at their base terminals (i.e., each experiences the same base-to-emitter voltage), and, as such, form a current mirror. Therefore, the currents through transistors 64, 79 and 99 are substantially the same and thus the currents through legs 70 and 90 are substantially the same.

Assume that the voltage signals supplied by output terminals O and $O_N$ of delay buffer 17 are at the same level (i.e., input terminals I and $I_N$ of delay buffer 17 are at the same voltage potential) and thus the base-to-emitter voltages of transistors 71 and 91 are the same. Since, as explained above, the currents through legs 70 and 90 and thus the currents through transistors 71 and 91 are the same, the voltage potential of a node from leg 70 is the same as that of a node from leg 90 if the sum of the indices of the two nodes is 7. For example, assuming that the terminals I and $I_N$ of delay buffer 17 have the same voltage potential, e.g. nodes ($P_0$ and $N_7$) have the same voltage potential, and so do nodes ($P_1$ and $N_6$), nodes ($P_2$ and $N_5$), etc.

If the voltage potential at terminal I becomes greater than that at terminal $I_N$ of delay buffer 17, the current flow through transistor 60 of fine delay buffer 17 increases and that through transistor 60 of fine delay buffer 17 decreases causing the voltages at output terminals O and $O_N$ of fine delay buffer 17 to respectively decrease and increase. Accordingly, since the currents through legs 70 and 90 are forced to be the same—due to similar base-to-emitter voltages of transistors 79 and 99—the voltage levels of nodes $P_0$, $P_1$, $P_2$, $P_3$, $P_4$, $P_5$, $P_6$, and $P_7$ rise while those of nodes $N_7$, $N_6$, $N_5$, $N_4$, $N_3$, $N_2$, $N_1$, and No decline. In contrast, if the voltage level at input terminal I becomes smaller than that at terminal $I_N$ of delay buffer 17, the voltage levels of nodes $P_0$–$P_7$ decline while those of nodes $N_7$–$N_0$ rise.

Since each of resistors 72–78 and 92–98 is selected to have the same resistance, the voltage drop across each of these resistors is the same.

The currents through legs 70 and 90 as well as the resistances of resistors 72–78 and 92–98 are selected such that the delay across each fine delay path 19 is substantially equal to that across a single coarse delay stage 12 so that the difference between the arrival times of a transition on signal EDGE on e.g. the MSBs of registers $18_i$ and $18_{i+1}$ is equal to the delay across a coarse delay stage 12.

Figure 8:
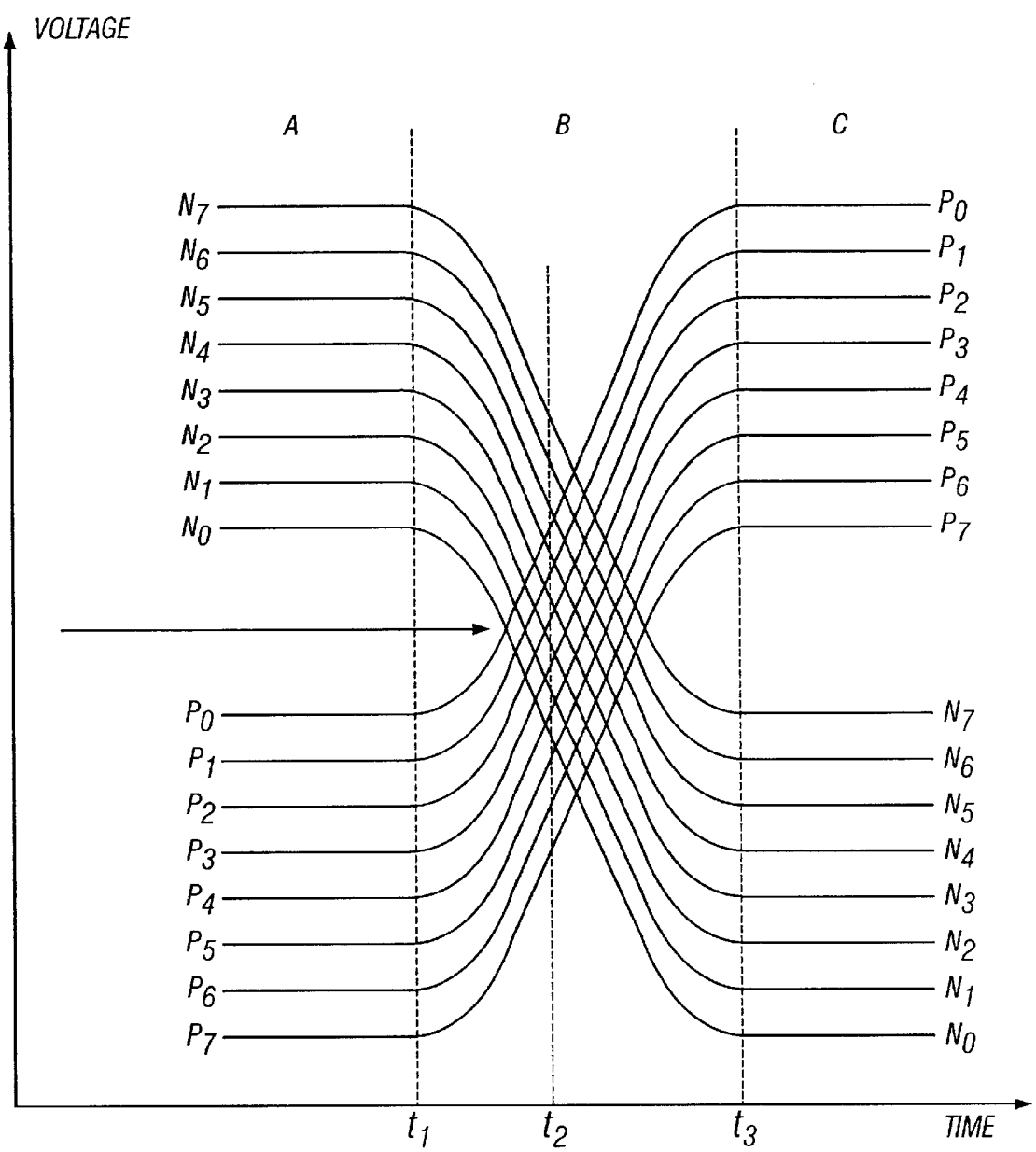
FIG. 8 shows the voltage level transitions of various nodes of the fine delay path of FIG. 7, in accordance with one embodiment.

FIG. 8 shows the variations in voltages of nodes $N_7$–$N_0$ and $P_0$–$P_7$ as a function of time when the voltage at output terminal O of fine delay buffer 17 changes from a differentially high to a differentially low level and that at output terminal $O_N$ changes from a differentially low to a differentially high level. The time dependence of the voltages of the above nodes is divided into three regions A, B and C—separated in time by t1 and t3—as described below.

In region A of FIG. 8 (prior to time t1), the voltage potentials of signals at terminals $O_N$ and O of fine delay buffer 17 are at differentially high and low levels respectively. Therefore, as seen in FIG. 8, the voltage potential at each of nodes $N_7$–$N_0$ is higher than that at each of nodes $P_0$–$P_7$; note that all the resistors coupled across these nodes in legs 70 and 90 have the same voltage drop.

In region B of FIG. 8 (between times t1 and t2), due to a change from a differentially high to a differentially low voltage of the signal at terminal O and a corresponding change from a differentially low to a differentially high voltage of the signal at terminal $O_N$, transistor 91 becomes less conductive while transistor 71—both of fine delay path 19—become more conductive. Accordingly, because the current flow through legs 70 and 90 is the same, the voltage potentials of nodes $P_0$–$P_7$ rise while those of nodes $N_7$–$N_0$ fall, as seen in region B of FIG. 8.

In region C (after time t2), all the transistors in legs 70 and 90 achieve a new equilibrium state in which the voltage potential at each of nodes $N_7$–$N_0$ is lower than the voltage potential at each of nodes $P_0$–$P_7$ Since the current flow through legs 70 and 90 before time t1 and after time t3 is the same, the voltage drop across each resistor in legs 70 and 90 prior to time t1 and after time t3 also remains the same.

Referring to FIG. 8, the time elapsed between the voltage level crossings (i.e., when the voltages reach the same level) of nodes ($P_i$, $N_i$) and ($P_{i+1}$, $N_{i+1}$) is equal to that between voltage level crossings of nodes ($P_{i+1}$, $N_{i+1}$) and ($P_{i+2}$, $N_{i+2}$), where i varies between 1 and 5. For example, if nodes ($P_2$, $N_2$) cross each other—in voltage—after an elapse of $\Delta t$ following the voltage level crossing of nodes ($P_2$, $N_1$), nodes ($P_3$, $N_3$) also cross each other—in voltage—after an elapse of $\Delta t$ following the voltage level crossing of nodes ($P_2$, $N_2$)

Also shown in FIG. 8 is t2 at which time signal CLK is applied to clock input terminal of each ECL register 30 of each register 18. As seen from FIGS. 6–8, the ECL register 30 of the register 18, receiving signals from node pairs ($P_0$ and $N_0$), stores a binary 1 when signal CLK arrives because the voltages at these two nodes cross each other prior to the arrival of signal CLK. For the same reason, the two ECL registers 30 of the register 18 receiving signals respectively from node pairs ($P_1$, $N_1$) and ($P_2$, $N_2$) each store a binary 1 when signal CLK arrives. However, the remaining five ECL registers of the register 18 respectively receiving signals from node pairs ($P_3$, $N_3$), ($P_4$, $N_4$), ($P_5$, $N_5$), ($P_6$, $N_6$) and ($P_7$, $N_7$) store a binary 0 when signal CLK arrives, as the voltages on each of these node pairs do not cross each other prior to the arrival of signal CLK.

Because there are 8 node pairs in legs 70 and 90, with each node pair providing differential input signals to D and $D_N$ input terminals of a different ECL register 30 of an 8-bit register 18, assuming that voltage level crossing of nodes ($P_{i+1}$, $N_{i+1}$) occurs $\Delta t$ time after that of nodes ($P_i$, $N_i$), a total of 8*$\Delta t$ time elapses between the times when the transition on signal EDGE arrives at input bits 0 and 7 of the same register 18.

In some embodiments, signal CLK operates at the frequency of 800 MHz. Resistors 42 and 43 of each coarse delay stage 12 each may have a resistance of e.g. 500 ohms; resistor 44 may have a resistance of e.g. 500 ohms. Supply voltages $V_{cc}$ and $V_{EE}$ respectively provide voltages of e.g. 0 and −5 volts. Signal C applied to the base terminal of bipolar transistor 44 is approximately at −3.8 volts. The differential voltages applied to input terminals I and $I_N$ vary between e.g. 0 and −0.3 volts thereby forcing the differential voltages generated at output terminals O and ON to vary between 0 and −0.3 volts. The above values result in a nominal delay of 40 psec through each coarse delay stage 12. In some embodiments, the minimum delay across each coarse delay stage 12 is approximately 37 psec; this delay increases to about 47 psec as the voltage level of signal C decreases by 400 mv.

When voltage $V_Q$ is at −2.9 volts and resistor 51 of slave bias 15 is selected to have a resistance of e.g. 500 ohms, signal VR at the emitter terminal of transistor 50 has a voltage of −3.8 volts.

Resistors 62, 63 and 65 of fine delay buffer 17 each have a resistance of 500 ohms. The differential voltages applied to input terminals I and $I_N$ vary between e.g. 0 and −0.5 volts thus causing the differential voltages generated at output terminals O and ON to vary between 0 and −0.3 volts.

The current flow through legs 70 and 90 of each fine delay stage 90 is e.g. 1.2 ma. The resistance of each resistor in legs 70 and 90 is e.g. 10 ohms. Therefore, the voltage drop across each of these resistors is e.g. 12 mv. The differential voltages applied to base terminals of bipolar transistors 71 and 91 vary between 0 and −0.3 volts. The time elapsed between the voltage level crossings of each two adjacent node pairs e.g. ($P_0$, $N_0$) and ($P_1$, $N_1$) is e.g. 5 psec, thereby enabling TDC 10 to record signal transition arrival times with a resolution of 5 psec.

Although, the above embodiment of TDC 10 uses differential signals, it is understood by those skilled in that art that the use of differential signals is optional. Other embodiments of the time-to-digital converter, in accordance with this disclosure, may or may not use differential signals.

Furthermore, it is understood that to record the arrival time of both low-to-high and high-to-low transitions on signal EDGE, two time-to-digital converters, in accordance with this disclosure, one for recording the low-to-high transitions and one for recording the high-to-low transitions are required.

The exemplary embodiments are illustrative and not limitative. The present disclosure is not limited by the particular technology (i.e., CMOS or Bipolar) used to fabricate the disclosed circuits. The present disclosure is not limited by the type of coarse delay stage, register, slave bias, fine delay buffer, priority encoder or fine delay path used in TDC 10.

Further modifications of the present disclosure are possible and are intended to fall within the scope of the appended claims.

I claim:

1. A time-to-digital converter for recording an arrival time of a signal with respect to a clock signal, the time-to-digital converter comprising:
    a coarse delay path which includes a plurality of coarse delay stages connected in series; wherein the signal is applied to an input terminal of the first coarse delay stage;
    a plurality of fine delay paths each coupled to an associated one of the coarse delay stages to receive a signal therefrom, each fine delay path including at least one fine delay stage and a plurality of nodes for propagating the signal; wherein the time-to-digital converter records the arrival time of the signal with respect to the clock signal by recording the number of the nodes in the fine delay paths through which the signal propagates.

2. The time-to-digital converter of claim 1 further comprising a plurality of registers, each register coupled to an associated one of the fine delay paths, wherein an input terminal of each register is coupled to a different one of the nodes of the fine delay path that is coupled to the register.

3. The time-to-digital converter of claim 2 further comprising a plurality of priority encoders, each priority encoder coupled to an associated one of the registers for receiving and performing on the contents of that register a priority operation.

4. The time-to-digital converter of claim 3 further comprising an edge detector for receiving and detecting transitions on the signal.

5. The time-to-digital converter of claim 4 further comprising a delay encoder for receiving the signal of each of the priority encoders and in response generating a signal corresponding to the arrival time of the signal, wherein the arrival time is determined by identifying one of fine delay paths through all whose nodes the signal propagates when the signal does not propagate through any of the nodes of the subsequent fine delay paths and fine delay paths through some but not all of whose nodes the signal propagates.

6. The time-to-digital converter of claim 5 further comprising a plurality of fine delay buffers, each fine delay buffer coupled to an associated one of the coarse delay stages to receive a signal therefrom, each fine delay buffer coupled to an associated one of the fine delay paths to supply a signal thereto.

7. The time-to-digital converter of claim 6 further comprising a second coarse delay path which includes coarse delay stages connected in series, wherein the clock signal is applied to an input terminal of the first coarse delay stage in the second coarse delay path, wherein a clock delay signal is generated at an output terminal of the last coarse delay stage in the second coarse delay path.

8. The time-to-digital converter of claim 7 wherein the clock and clock delay signals are substantially in phase and wherein the clock delay signal lags the clock signal by one period of the clock signal.

9. The time-to-digital converter of claim 8 further comprising a plurality of slave bias circuits, each slave bias circuit coupled to an associated one of the coarse delay stages in both the first and second coarse delay paths to control respectively delay of the signal and the clock signal therethrough.

10. The time-to-digital converter of claim 9 further comprising a second plurality of slave bias circuits, each slave bias circuit in the second plurality being coupled to an associated one of the fine delay buffers.

11. The time-to-digital converter of claim 10 further comprising a phase detector for receiving the clock and clock delay signals and for generating a signal that is received by each of the slave bias circuits in the first and second pluralities of slave bias circuits, wherein the voltage level of the signal generated by the phase detector varies to thereby equalize the phases of the clock and clock delay signals.

12. The time-to-digital converter of claim 11 wherein the delay encoder further receives an output signal of the edge detector for detecting the transitions on the signal.

13. The time-to-digital converter of claim 12 wherein each of the signal and clock signal includes a pair of differential signals, each having a differentially high and a differentially low signal.

14. The time-to-digital converter of claim 13 wherein the time-to-digital converter records the arrival time of the signal within one period of the clock signal.

15. The time-to-digital converter of claim 14 wherein each coarse delay stage comprises:
    a first transistor having a control terminal for receiving a first input signal, a first current handling terminal coupled to a first terminal of a first resistor whose second terminal is coupled to a first voltage supply, and a second current handling terminal;

a second transistor having a control terminal for receiving a first input signal, a first current handling terminal coupled to a first terminal of a second resistor whose second terminal is coupled to the first voltage supply, and a second current handling terminal;

a third transistor having a control terminal for receiving a third input signal, a first current handling terminal coupled to the second current handling terminals of the first and second transistors and a second current handling terminal coupled to a first terminal of a third resistor whose second terminal is coupled to a second voltage supply.

16. The time-to-digital converter of claim 15 wherein each fine delay buffer circuit comprises:

a first transistor having a control terminal for receiving a first input signal, a first current handling terminal coupled to a first terminal of a first resistor whose second terminal is coupled to the first voltage supply, and a second current handling terminal;

a second transistor having a control terminal for receiving a first input signal, a first current handling terminal coupled to a first terminal of a second resistor whose second terminal is coupled to the first voltage supply, and a second current handling terminal;

a third transistor having a control terminal for receiving a third input signal, a first current handling terminal coupled to the second current handling terminals of the first and second transistors and a second current handling terminal coupled to a first terminal of a third resistor whose second terminal is coupled to the second voltage supply.

17. The time-to-digital converter of claim 16 wherein each input terminal of each register includes first and second terminals each for receiving a differentially high or a differentially low signal.

18. The time-to-digital converter of claim 17 wherein each fine delay path includes first and second legs, each leg including a plurality of resistors and nodes between adjacent resistors, wherein in each fine delay path each of the nodes in the first leg forms a node pair with a different one of the nodes of the second leg, wherein the first and second nodes of each node pair are coupled to the differential input terminals of a different one of the input terminals of the register coupled to the fine delay path.

19. The time-to-digital converter of claim 18 wherein the resistance of each of the resistors in each of the first and second legs of each of the fine delay paths is substantially the same.

20. The time-to-digital converter of claim 19 wherein the current through the first and second legs of each of the fine delay paths is substantially the same.

21. The time-to-digital converter of claim 20 wherein the first leg of each fine delay path further comprises:

a first transistor having a control terminal coupled to an output terminal of the fine delay path's associated fine delay buffer, a first current handling terminal coupled to a first voltage supply and a second current handling terminal coupled to the first one of the nodes of the first leg;

a second transistor having a first current handling terminal coupled to the last one of the nodes of the first leg, a second current handling terminal coupled to a first terminal of a resistor in the leg whose second terminal is coupled to a second voltage supply, and a control terminal coupled to the control terminal of the third transistor of the fine delay path's associated fine delay buffer.

22. The time-to-digital converter of claim 21 wherein the second leg of each fine delay path further comprises:

a first transistor having a control terminal coupled to an output terminal of the fine delay path's associated fine delay buffer, a first current handling terminal coupled to the first voltage supply and a second current handling terminal coupled to the first one of the nodes of the first leg;

a second transistor having a first current handling terminal coupled to the last one of the nodes of the first leg, a second current handling terminal coupled to a first terminal of a resistor in the leg whose second terminal is coupled to the second voltage supply, and a control terminal coupled to the control terminal of the third transistor of the fine delay path's associated fine delay buffer.

23. The time-to-digital converter of claim 22 wherein in each fine delay path the time elapsed between voltage crossing of the first and second nodes of a first node pair and the voltage crossing of the first and second nodes of a second node pair is equal to the time elapsed between the voltage crossing of the first and second nodes of the second node pair and the voltage crossing between the first and second nodes of a third node pair, wherein in the first leg the first nodes of the first and second node pairs are coupled across first and second terminals of a different one of the resistors and wherein the first node of the third node pair is coupled to a first terminal of another one of the resistors whose second terminal is coupled to the first node of the second node pair; wherein in the second leg the second nodes of the first and second node pairs are coupled across first and second terminals of a different one of the resistors and wherein the second node of the third node pair is coupled to another one of the resistors whose second terminal is coupled to the second node of the second node pair.

24. The time-to-digital converter of claim 23 wherein the number of fine delay paths is equal to 32 and each has 8 nodes.

25. The time-to-digital converter of claim 24 wherein the edge detector for detecting a transition on the signal comprises an AND gate which receives the signal at its first input terminal which is not an inverted terminal and which receives the delayed signal at its second terminal which is an inverted terminal.

26. The time-to-digital converter of claim 25 wherein the output terminal of the last coarse delay stage in the first coarse delay path is coupled to an input terminal of a coarse delay stage.

27. The time-to-digital converter of claim 26 wherein each priority encoder is a registered priority encoder further including a combinatorial priority encoder and an associated register, the combinatorial priority encoder for performing the priority function and supplying a signal to the associated register.

28. The time-to-digital converter of claim 27 wherein each register bit of each register and each register bit of each associated register of each registered priority encoder has a pair of data input terminals for receiving the differential signals of the first and second nodes of a different one of the node pairs of the fine delay path coupled to that register and that registered priority encoder.

29. A method for recording an arrival time of a signal with respect to a clock signal, comprising the acts of:

propagating the signal through at least one of a first plurality of coarse delay stages connected in series;

propagating the signal through at least one of a plurality of fine delay paths, each fine delay path coupled to an associated one of the coarse delay stages, each fine delay path having at least one fine delay stage and a plurality of nodes; and recording from among the nodes of the fine delay paths, the number of nodes through which the signal propagates, which number is representative of the arrival time of the signal with respect to the clock signal.

30. The method of claim 29 further comprising the act of storing signals present at the nodes of each of the fine delay paths.

31. The method of claim 30 further comprising the act of priority encoding the signals stored from each of the nodes and in response thereto generating a priority encoded signal.

32. The method of claim 31 further comprising the act of detecting a transition on the signal.

33. The method of claim 32 further comprising the act of identifying one of fine delay paths through all whose nodes the signal propagates when the signal does not propagate through any of the nodes of the subsequent fine delay paths and fine delay paths through some but not all of whose nodes the signal propagates.

34. The method of claim 33 further comprising buffering the signals generated by each coarse delay stage and supplying each buffered signal to a different one of the fine delay paths.

35. The method of claim 34 further comprising the act of controlling the time delay through each of the fine delay buffers.

36. The method of claim 35 further comprising the act of propagating the clock signal through each of a second group of coarse delay stages being coupled in series to thereby generate a clock delay signal which is substantially in phase with the clock signal but lags the clock signal by one period of the clock signal.

37. The method of claim 36 further comprising the act of controlling the delay through each coarse delay stage in the first plurality of coarse delay stages.

38. The method of claim 37 further comprising the act of controlling the delay through each coarse delay stage in the second plurality of coarse delay stages.

39. The time-to-digital converter of claim 38 further comprising detecting a difference between the phases of the clock and clock delay signals and generating a signal to thereby equalize the phases of the clock and clock delay signals.

40. The time-to-digital converter of claim 39 wherein the act of recording the arrival time of the signal with respect to the clock signal includes recording the arrival time of the signal with respect to the clock signal, each of which two signals includes a pair of differential signals each including a differentially high and a differentially low signal.

41. The time-to-digital converter of claim 40 wherein the act of recording the arrival time of the signal with respect to the clock signal includes recording the arrival time of the signal with respect to the clock signal within one period of the clock signal.

42. The method of claim 41 wherein at least one of the coarse delay stages comprises:

a first transistor having a control terminal for receiving a first input signal, a first current handling terminal coupled to a first terminal of a first resistor whose second terminal is coupled to a first voltage supply, and a second current handling terminal;

a second transistor having a control terminal for receiving a first input signal, a first current carrying terminal coupled to a first terminal of a second resistor whose second terminal is coupled to the first voltage supply, and a second current handling terminal;

a third transistor having a control terminal for receiving a third input signal, a first current handling terminal coupled to the second current carrying terminals of the first and second transistors and a second current handling terminal coupled to a first terminal of a third resistor whose second terminal is coupled to a second voltage supply.

43. The method of claim 42 wherein the act of buffering includes buffering by a delay buffer which comprises:

a first transistor having a control terminal for receiving a first input signal, a first current handling terminal coupled to a first terminal of a first resistor whose second terminal is coupled to the first voltage supply, and a second current handling terminal;

a second transistor having a control terminal for receiving a first input signal, a first current handling terminal coupled to a first terminal of a second resistor whose second terminal is coupled to the first voltage supply, and a second current handling terminal;

a third transistor having a control terminal for receiving a third input signal, a first current handling terminal coupled to the second current carrying terminals of the first and second transistors and a second current carrying terminal coupled to a first terminal of a third resistor whose second terminal is coupled to the second voltage supply.

44. The method of claim 43 wherein each fine delay path includes first and second legs each leg including a plurality of resistors and nodes between adjacent resistors, wherein in each fine delay path each of the nodes in the first leg forms a node pair with a different one of the nodes of the second leg, wherein each node pair provides a pair of differential signals.

45. The method of claim 44 wherein the act of storing signal includes the act of storing differential signals provided by each node pair of each fine delay path.

46. The method of claim 45 further comprising the act of providing substantially the same resistance for each of the resistors in the first leg and the second leg of each of the fine delay paths.

47. The method of claim 46 further comprising the act of passing substantially the same currents through the first and second legs of each of the fine delay paths.

48. The method of claim 47 wherein the first leg of each fine delay path further comprises:

a first transistor having a control terminal coupled to an output terminal of the fine delay path's associated fine delay buffer, a first current handling terminal coupled to a first voltage supply and a second current handling terminal coupled to the first one of the nodes of the first leg;

a second transistor having a first current handling terminal coupled to the last one of the nodes of the first leg, a second current handling terminal coupled to a first terminal of a resistor in the leg whose second terminal is coupled to a second voltage supply, and a control terminal coupled to the control terminal of the third transistor of the fine delay path's associated fine delay buffer.

49. The method of claim 48 wherein the second leg of each fine delay path further comprises:

a first transistor having a control terminal coupled to an output terminal of the fine delay path's associated fine delay buffer, a first current handling terminal coupled to the first voltage supply and a second current handling terminal coupled to the first one of the nodes of the first leg;

a second transistor having a first current handling terminal coupled to the last one of the nodes of the first leg, a second current handling terminal coupled to a first terminal of a resistor in the leg whose second terminal is coupled to the second voltage supply, and a control terminal coupled to the control terminal of the third transistor of the fine delay path's associated fine delay buffer.

50. The time-to-digital converter of claim 49 wherein in each fine delay path the time elapsed between voltage crossing of the first and second nodes of a first node pair and the voltage crossing of the first and second nodes of a second node pair is equal to the time elapsed between the voltage crossing of the first and second nodes of the second node pair and the voltage crossing between the first and second nodes of a third node pair, wherein in the first leg the first nodes of the first and second node pairs are coupled across first and second terminals of a different one of the resistors and wherein the first node of the third node pair is coupled to a first terminal of another one of the resistors whose second terminal is coupled to the first node of the second node pair; wherein in the second leg the second nodes of the first and second node pairs are coupled across first and second terminals of a different one of the resistors and wherein the second node of the third node pair is coupled to a first terminal of another one of the resistors whose second terminal is coupled to the second node of the second node pair.

51. The method of claim 50 wherein the number of coarse delay stages is equal to 32 and each has 8 nodes.

52. The method of claim 51 further comprising the act of ANDing the signal with a delayed replica of the signal thereby to detect a transition on the signal.

* * * * *